(12) United States Patent
Tu et al.

(10) Patent No.: US 7,646,087 B2
(45) Date of Patent: Jan. 12, 2010

(54) MULTIPLE-DIES SEMICONDUCTOR DEVICE WITH REDISTRIBUTED LAYER PADS

(75) Inventors: Chao-Chun Tu, Hsin-Chu (TW); Yang-Hui Fang, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 69 days.

(21) Appl. No.: 11/855,163

(22) Filed: Sep. 14, 2007

(65) Prior Publication Data

US 2008/0001296 A1  Jan. 3, 2008

Related U.S. Application Data

(63) Continuation-in-part of application No. 11/108,407, filed on Apr. 18, 2005, now abandoned.

(51) Int. Cl.
H01L 23/02 (2006.01)
H01L 23/48 (2006.01)
H01L 23/52 (2006.01)
H01L 29/40 (2006.01)

(52) U.S. Cl. .................. 257/686; 257/777; 257/784; 257/E23.001; 257/E23.085

(58) Field of Classification Search .................. 257/686, 257/777, E23.001, E23.085, 784
See application file for complete search history.

(56) References Cited

U.S. PATENT DOCUMENTS

| | | | |
|---|---|---|---|
| 5,502,337 A | 3/1996 | Nozaki | |
| 6,078,088 A | 6/2000 | Buynoski | |
| 6,265,778 B1 | 7/2001 | Tottori | |
| 6,303,977 B1 | 10/2001 | Schroen | |
| 6,445,018 B1 | 9/2002 | Okuaki | |
| 6,483,176 B2 | 11/2002 | Noguchi | |
| 6,486,558 B2 | 11/2002 | Sugiyama | |
| 6,489,689 B2 | 12/2002 | Nojiri | |
| 6,552,416 B1* | 4/2003 | Foster | 257/666 |
| 6,777,815 B2* | 8/2004 | Huang | 257/778 |
| 7,115,985 B2 | 10/2006 | Antol | |
| 7,122,904 B2* | 10/2006 | Tsai et al. | 257/778 |
| 7,170,115 B2 | 1/2007 | Tokunaga | |
| 7,189,593 B2* | 3/2007 | Lee | 438/107 |
| 7,245,011 B2* | 7/2007 | Liu | 257/724 |
| 7,268,018 B2* | 9/2007 | Moxham | 438/118 |
| 7,326,592 B2* | 2/2008 | Meyer et al. | 438/110 |
| 2001/0015773 A1* | 8/2001 | Eldridge et al. | 348/765 |

(Continued)

FOREIGN PATENT DOCUMENTS

CN  1314708  9/2001

(Continued)

*Primary Examiner*—Ida M Soward
(74) *Attorney, Agent, or Firm*—Winston Hsu

(57) ABSTRACT

A semiconductor device includes a first semiconductor die and a second semiconductor die. The first semiconductor includes a plurality of first bond pads formed on a peripheral region of the first semiconductor die, a plurality of re-distributed layer (RDL) pads formed on a center region of the first semiconductor die, and a plurality of wire routes interconnecting the first bond pads and the RDL pads. The second semiconductor die is disposed over the first semiconductor die, wherein the second semiconductor die has a plurality of second bond pads electrically connecting to the RDL pads via bonding wires; wherein the RDL pad is supported by at least a layer of stress-releasing metal disposed directly underneath the RDL pad.

9 Claims, 9 Drawing Sheets

U.S. PATENT DOCUMENTS

| | | |
|---|---|---|
| 2001/0020735 A1 | 9/2001 | Chikawa |
| 2002/0043668 A1 | 4/2002 | Tokunaga |
| 2003/0218259 A1 | 11/2003 | Chesire |
| 2004/0164418 A1 | 8/2004 | Sugiura |
| 2005/0067707 A1 | 3/2005 | Hashimoto |
| 2005/0104171 A1* | 5/2005 | Benson et al. .............. 257/678 |
| 2005/0146042 A1 | 7/2005 | Yamaha |
| 2006/0244156 A1 | 11/2006 | Cheng |
| 2007/0018333 A1* | 1/2007 | Tsai et al. .................. 257/777 |

FOREIGN PATENT DOCUMENTS

| | | |
|---|---|---|
| CN | 1855468 | 11/2006 |

* cited by examiner

US 7,646,087 B2

MULTIPLE-DIES SEMICONDUCTOR DEVICE WITH REDISTRIBUTED LAYER PADS

CROSS REFERENCE TO RELATED APPLICATIONS

This is a continuation-in-part of U.S. application Ser. No. 11/108,407 filed Apr. 18, 2005.

BACKGROUND OF THE INVENTION

1. Field of the Invention

The present invention relates generally to semiconductor integrated circuit (IC) devices and, more particularly, to a semiconductor IC chip with bond pad structures formed over a circuit region.

2. Description of the Prior Art

Performance characteristics of semiconductor devices are typically improved by reducing device dimensions, resulting in increased device densities and increased device packaging densities. This increase in device density places increased requirements on the interconnection of semiconductor devices, which are addressed by the packaging of semiconductor devices. One of the key considerations in the package design is the accessibility of the semiconductor device or the Input/Output (I/O) capability of the package after one or more devices have been mounted in the package.

In a typical semiconductor device package, the semiconductor die can be mounted or positioned in the package and can further be connected to interconnect lines of the substrate by bond wires or solder bumps. For this purpose the semiconductor die is provided with bond pads that are typically mounted around the periphery of the die and not formed over regions containing active or passive devices. FIG. 1 is schematic plan view showing a conventional layout of bond pads over a semiconductor die. In FIG. 1, a semiconductor die 10 is provided with a first region 12 in which active and/or passive devices (not shown) are formed. The first region 12 is separated from a second region 14, over which bond pads 16 are formed.

One reason the bond pads 16 are not formed over the first region 12 is related to the thermal and/or mechanical stresses that occur during the conductive bonding process. During conductive bonding, wires or bumps are connected from the bond pads to a supporting circuit board or to other means of interconnections.

Therefore, materials for intermetal dielectrics (not shown) incorporated in a interconnect structure of the semiconductor die 10, typically adjacent to and/or underlying the bond pads 16, are susceptible to damage during the conductive bonding due to insufficient mechanical strength against the bonding stresses. Thus, direct damage to the active or passive devices underlying the intermetal dielectric layers can be avoided since bond pads are provided around the periphery of the die. In such a design, however, overall die size cannot be significantly reduced since the bond pads 16 occupy a large portion of the top surface of the semiconductor die 10, causing extra manufacturing cost.

SUMMARY OF THE INVENTION

It is one object of the present invention to provide an improved integrated circuit chip having a reinforced bonding pad structure capable of saving valuable silicon estate.

Bond pad structures and semiconductor devices using the same are provided. An exemplary embodiment of a semiconductor device comprises a substrate. An intermediate structure is disposed over the substrate. A bond pad structure is disposed over the intermediate structure. The intermediate structure comprises a first metal layer neighboring and supporting the bond pad structure and a plurality of second metal layers underlying the intermediate structure, wherein one of the second metal layers functions as a power line.

An exemplary embodiment of a bond pad structure, capable of distributing power, comprises a first dielectric layer having a power line therein. A second dielectric layer having a hollow metal portion therein overlies the first dielectric layer. A third dielectric layer having a bond pad overlies the second dielectric layer, wherein the bond pad overlies the hollow metal portion and the power line, and are electrically connected therewith.

From one aspect of this invention, a semiconductor device comprises a first semiconductor die and a second semiconductor die. The first semiconductor die comprises a plurality of first bond pads formed on a peripheral region of the first semiconductor die, a plurality of re-distributed layer (RDL) pads formed on a center region of the first semiconductor die, and a plurality of wire routes interconnecting the first bond pads and the RDL pads. The second semiconductor die is disposed over the first semiconductor die, wherein the second semiconductor die has a plurality of second bond pads electrically connecting to the RDL pads via bonding wires; wherein the RDL pad is supported by at least a layer of stress-releasing metal disposed directly underneath the RDL pad.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Bond pad structures and semiconductor devices using the same will now be described in detail. Such exemplary embodiments as will be described, can potentially reduce overall semiconductor die size. In some embodiments, this can be accomplished by forming bond pads over a circuit region with underlying electrical devices and interconnecting lines.

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers. The use of the term "low dielectric constant" or "low k" herein means a dielectric constant (k value) that is less than the dielectric constant of a conventional silicon oxide. Preferably, the low k dielectric constant is less than about 4.

Figure 1:
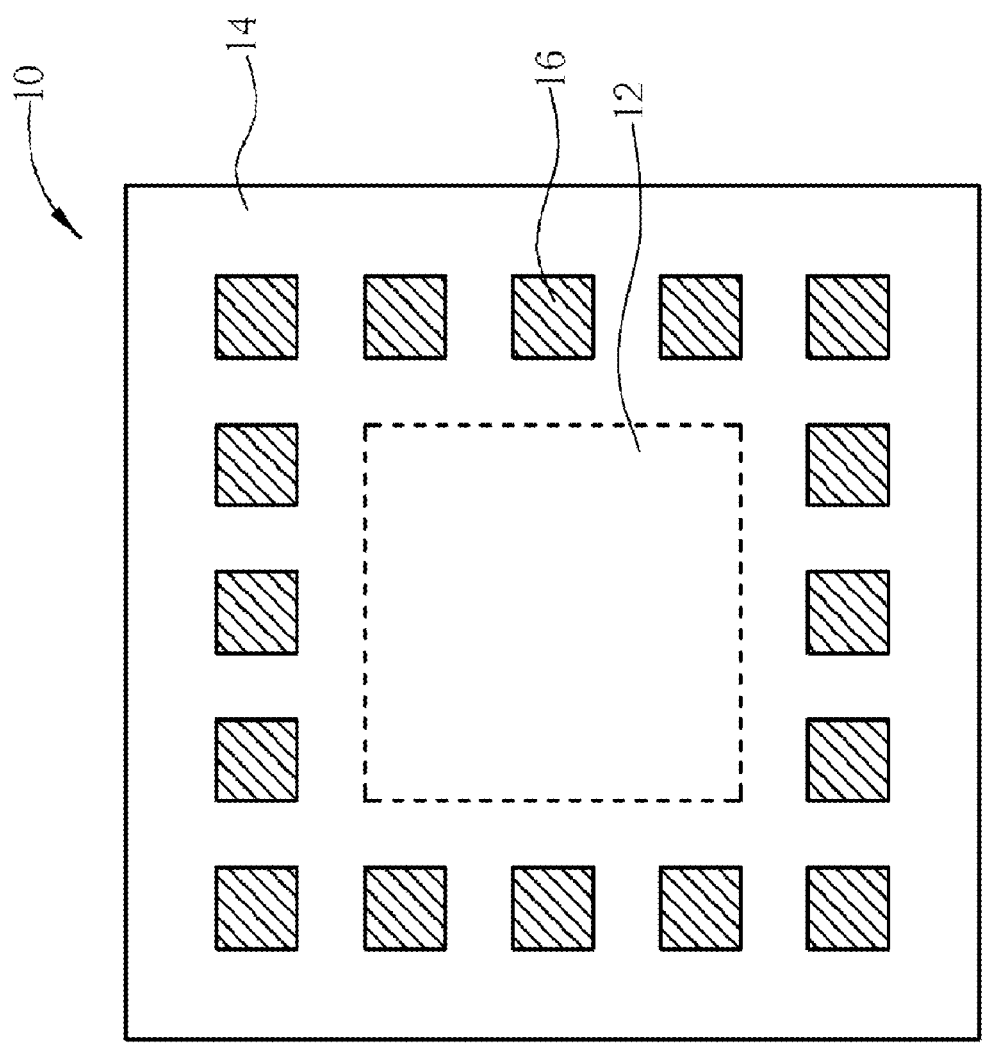
FIG. 1 is a plan view showing a conventional layout of bond pads over a semiconductor die.
Figure 2:
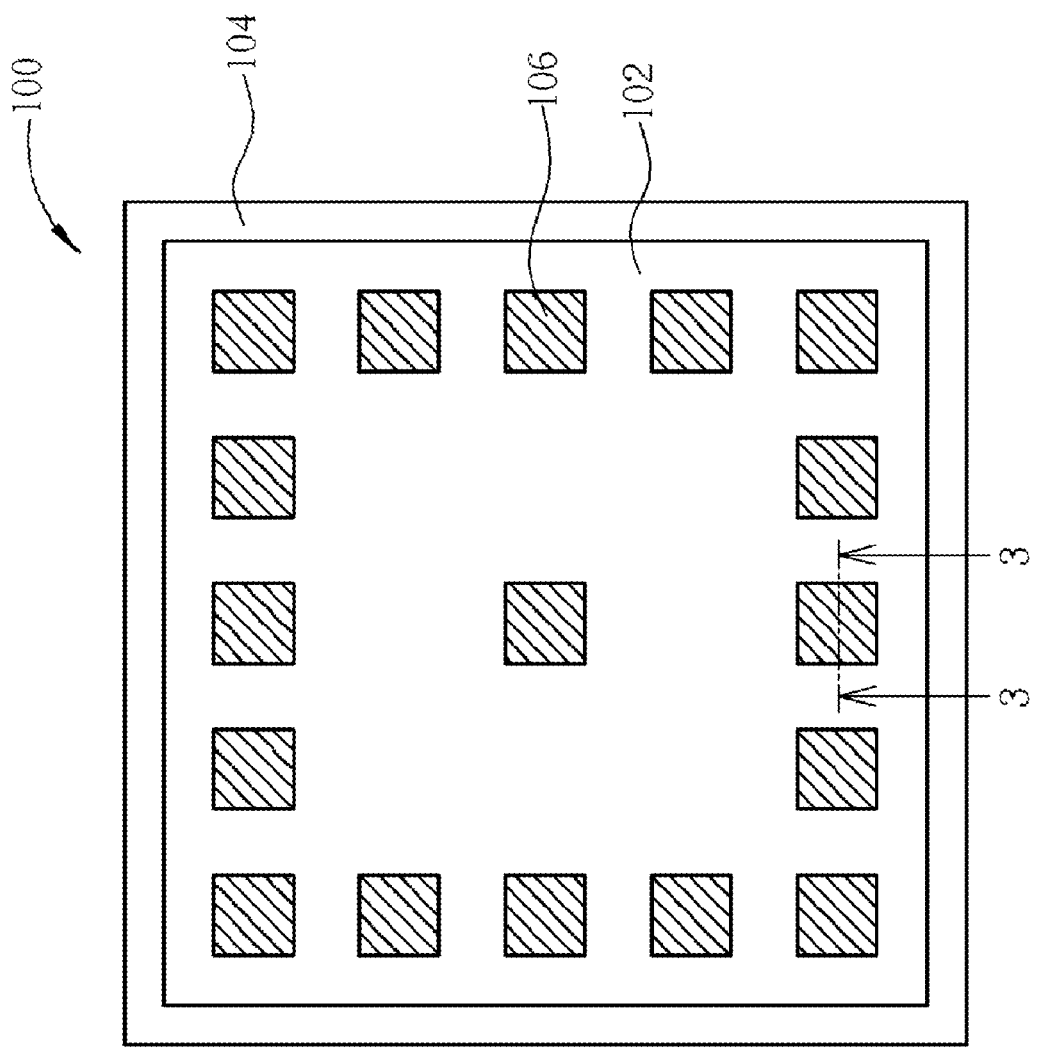
FIG. 2 is a plan view showing a bond pad layout over a semiconductor device, according to an embodiment of the invention.

FIG. 2 is a schematic plan view of an exemplary embodiment of a semiconductor die 100. The semiconductor die 100 is provided with a circuit region 102 surrounded by a peripheral region 104. For example, the peripheral region 104 may be a guard ring region, which protects the circuit region 102 from damage due to die separation or dicing. As shown in FIG. 2, bond pads 106 are formed on the periphery and/or center of the circuit region 102. Layouts of the bond pads 106 over the semiconductor die 100 are not limited to those illustrated in FIG. 2 and can be modified by those skilled in the art.

Figure 3:
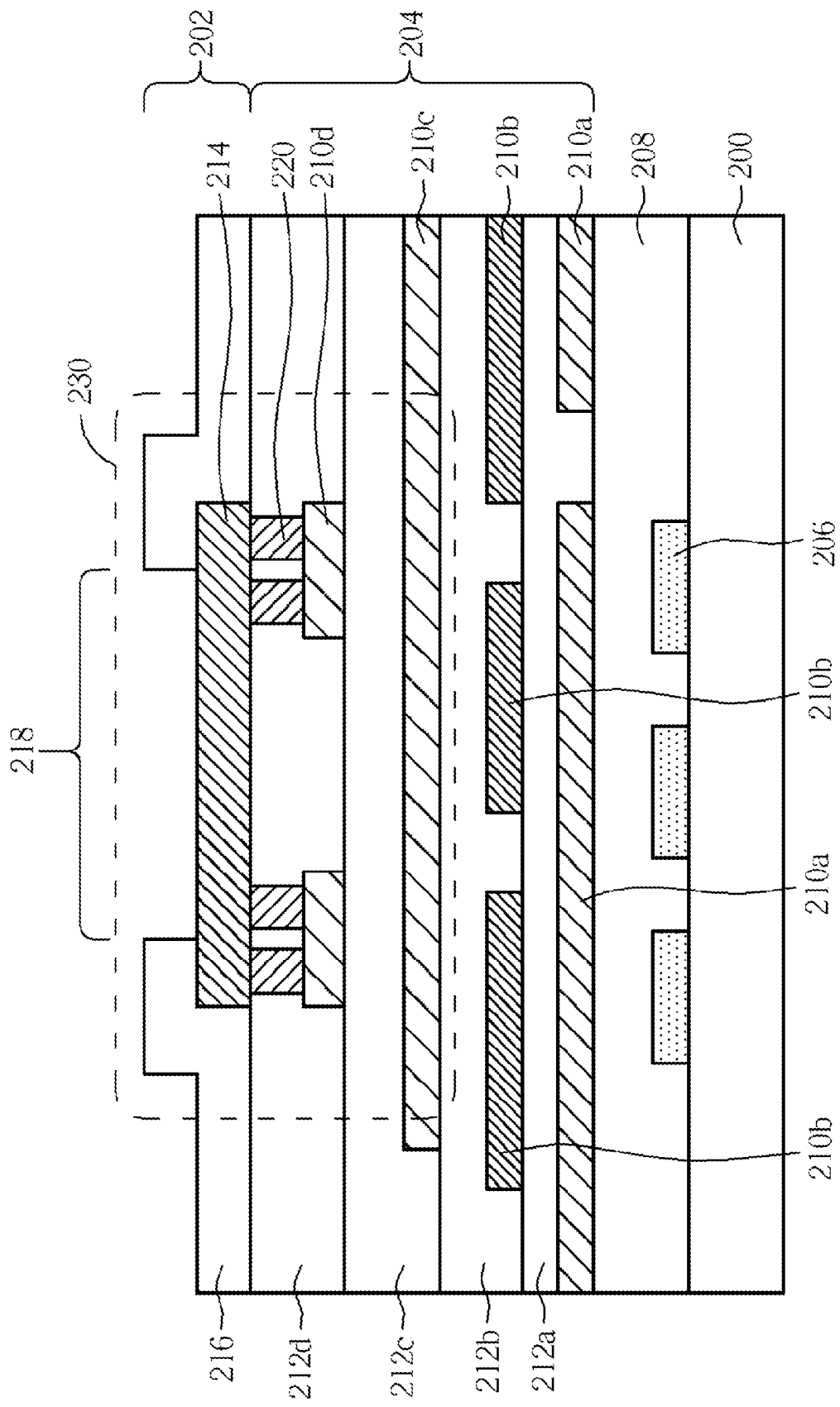
FIG. 3 is a cross section taken along line 3-3 in FIG. 2, showing a structure of the semiconductor device.

FIG. 3 is a cross section along line 3-3 in FIG. 2, showing a semiconductor device having a bond pad structure 202 formed over a substrate 200. In FIG. 3, the substrate 200 is provided with devices 206 thereon. The devices 206 can be active devices such as metal-oxide semiconductor (MOS) transistors, or passive devices such as capacitors, inductors, and resistors. These devices 206 are not limited to being formed on the substrate 200 and some of these devices 206 can be formed in the substrate 200 to thereby enhance die size reduction. Devices 206 can be formed by well-known fabrication methods and as such will not be described here.

Dielectric layer 208 is provided over/between the devices 206 and an intermediate structure 204 is provided on the dielectric layer 208. The dielectric layer 208 provides insulation between the devices 206. The intermediate structure 204 comprises a plurality of metal layers 210a, 210b, 210c, and 210d respectively formed within dielectric layers 212a, 212b, 212c, and 212d, thereby functioning as an interconnect structure for electrically connecting the underlying devices 206 and the overlying bond pad structure 202. In some cases, the intermediate structure 204 electrically connecting the overlying bond pad structure 202 may electrically connect the electric device at any region within the semiconductor die. Connection therebetween can be achieved by forming conductive contacts (not shown) in the dielectric layer 208 at a position relative to the device 206 and is well known by those skilled in the art.

The metal layers 210a-d can be substantially arranged along the x or y direction shown in FIG. 2 and are electrically connected by conductive vias (not shown) properly formed in the dielectric layers 212a-d. The conductive layers 210a-d can function as routing, signal or power lines along or in combination. Fabrication of such an intermediate structure 204 can be achieved by well known interconnect fabrication methods, such as single/dual damascene process or other known line fabricating techniques. The metal layers 210a-d can comprise, for example, copper, aluminum, or alloys thereof. The dielectric layers 212a-d can comprise, for example, doped or undoped oxide or commercially available low k dielectrics and can be formed by, for example, plasma enhanced chemical vapor deposition (PECVD).

Still referring to FIG. 3, the bond pad structure 202 formed over the topmost dielectric layer 212d of the intermediate structure 204 includes a metal pad 214 partially covered by a passivation layer 216 and an exposed bonding region 218 for sequential conductive bonding. Metal pad 214 and the passivation layer 216 can be formed by well-known pad fabrications and will not be described here. The metal pad 214 can be, for example, a pad comprising aluminum, copper, or alloys thereof. The passivation layer 216 can comprise, for example, silicon nitride or silicon oxide and preferably comprises silicon nitride.

As shown in FIG. 3, the metal pad 214 is formed above a circuit region having underlying interconnecting lines (referring to metal layers 210a-d) and devices 206. Thus, the topmost metal layer 210d of the intermediate structure 204 can from with metal patterns insulated from the underlying metal layers 210a-c. The metal layers 210d can provide mechanical support to the overlying metal pad 214 and sustain stresses caused in sequential bonding processes. For this purpose, additional conductive vias 220 are required and provided in the portion of the dielectric layer 212d between the metal pad 214 and the underlying metal layer 210d to thereby enhance upward mechanical support.

Figure 4:
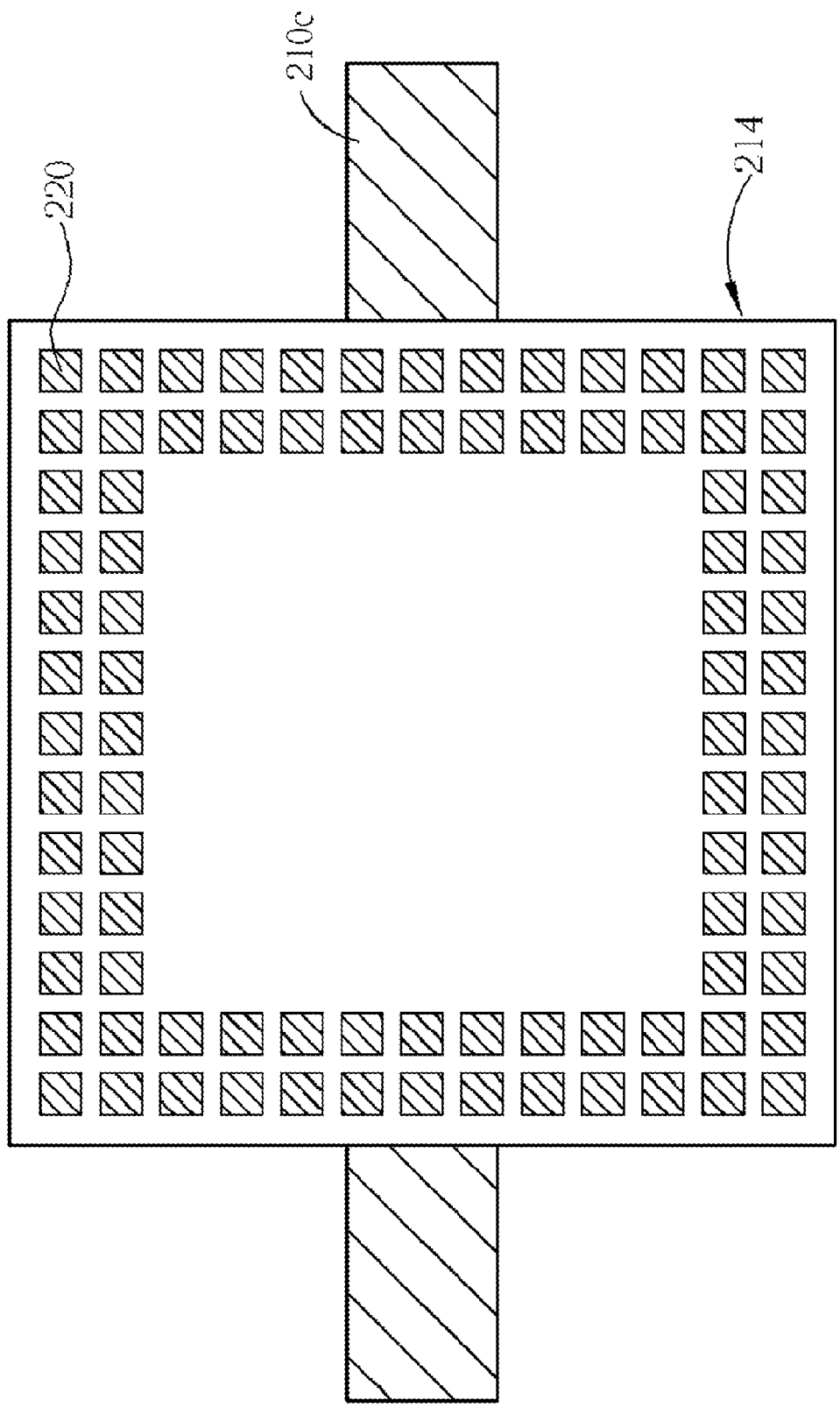
FIGS. 4-5 are perspective plan views showing various layouts of a region 230 in FIG. 3.
Figure 5:
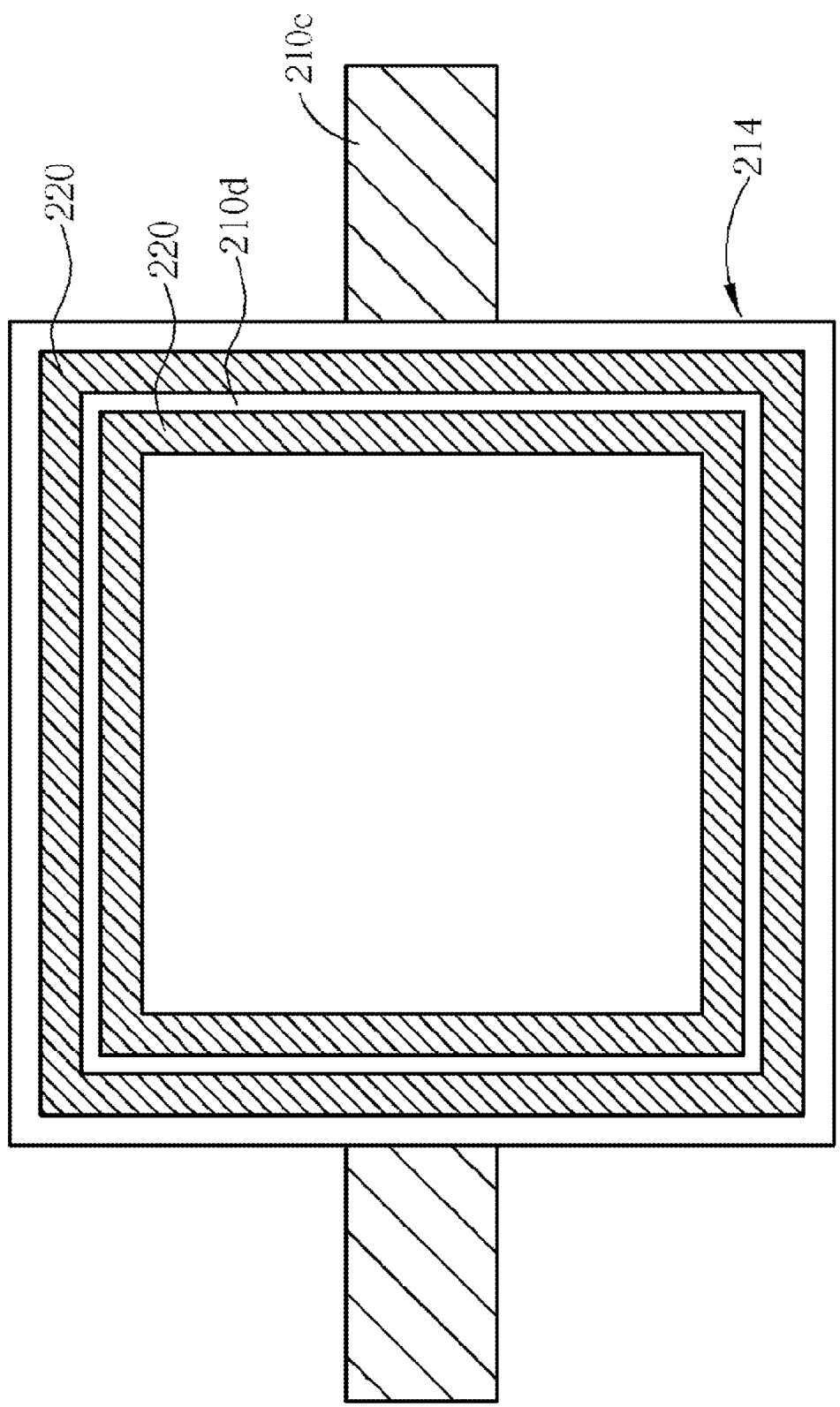

FIGS. 4-5 are perspective plan views showing configuration within a region 230 in FIG. 3. As shown in FIG. 4, the conductive vias 220 are formed as a plurality of conductive plugs surrounding a periphery of the metal pad 214. These conductive vias 220 in FIG. 4 are arranged in an orderly manner, for example, two by two along the periphery of the metal pad 214 and are electrically insulated from each other by the dielectric layer 212d (not shown). One of the underlying metal layers 210a-c of the intermediate structure 204, for example the metal layer 210c, can be disposed underneath the metal pad 214 to thereby enhance integrity of a semiconductor device and achieve maximum integrity when the metal layer 210c functions as a power line. In FIG. 5, a varied layout of the conductive vias 220 which are formed as two individual continuous conductive trenches within the dielectric layer 212d is shown. The conductive trenches annularly surround the periphery of the metal pad 214 and one of the underlying metal layers 210a-c of the intermediate structure 204, for example the metal layer 210c, can be disposed underneath the metal pad 214 to enhance integrity of a semiconductor device and achieve a maximum integrity when the metal layer 210c functions as a power line.

Figure 6:
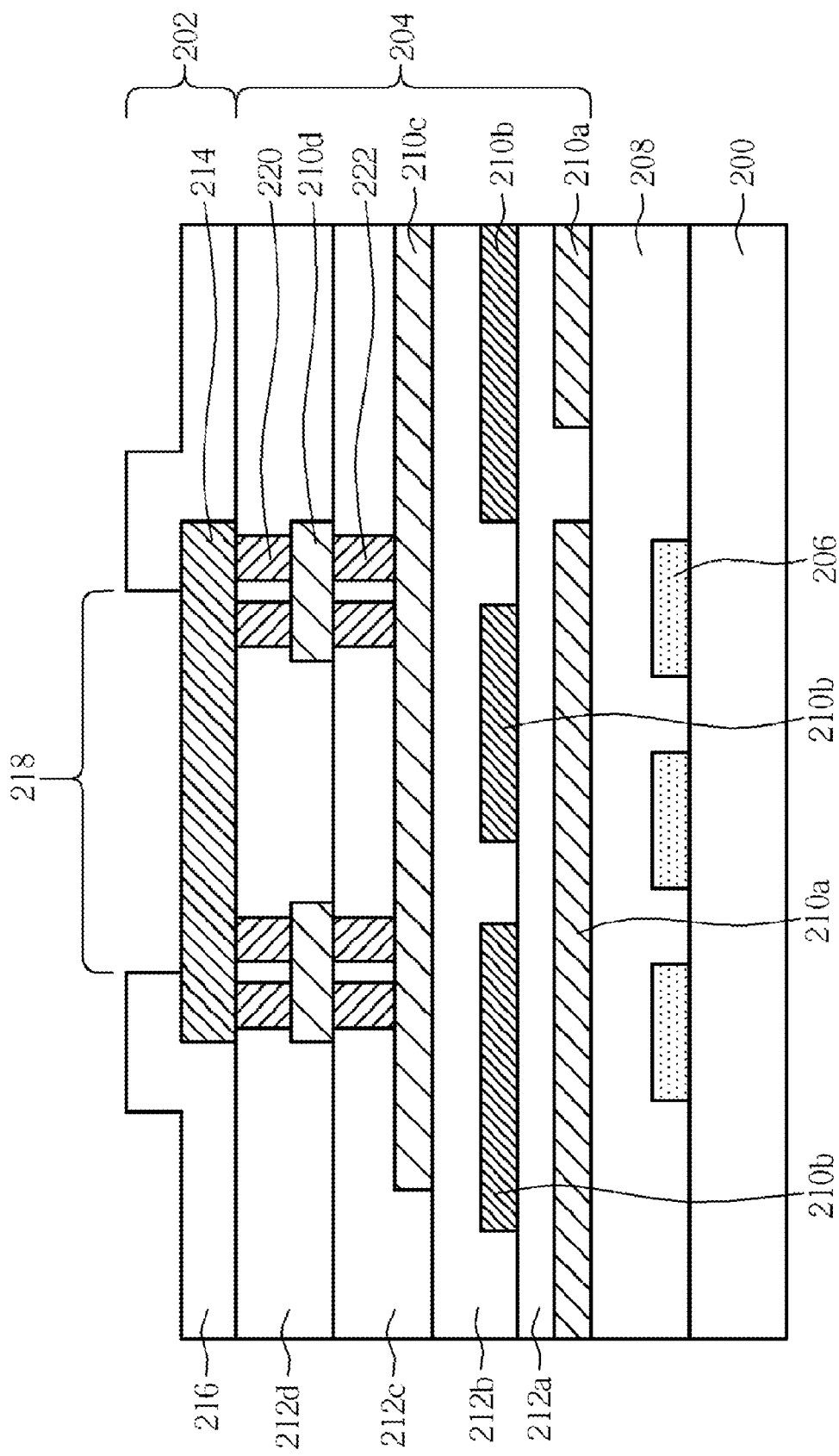
FIG. 6 is a cross section of an exemplary embodiment of a semiconductor device, having a bond pad structure capable of distributing power.

FIG. 6 shows a cross section of another exemplary embodiment of a semiconductor device with a bonding pad structure, in which like numbers from the described exemplary embodiment are utilized where appropriate. In this embodiment, the bond pad structure is illustrated as a bond pad for power distributing. As shown in FIG. 6, the bond pad structure 202 formed on the topmost dielectric layer 212d of the intermediate structure 204 has a metal pad 214 partially covered by a passivation layer 216 and exposes a bonding region 218 for sequential conductive bonding. Metal pad 214 and the topmost passivation layer 216 can be formed by well known pad fabrication methods and will not be described here. The metal pad 214 can be, for example, a pad comprising aluminum, copper, or alloys thereof. The passivation layer 216 may comprise, for example, silicon nitride or silicon oxide and preferably comprises silicon nitride.

As shown in FIG. 6, the metal pad 214 is now formed above a circuit region having underlying interconnecting lines (referring to metal layers 210a-d) and devices 206. In this embodiment, the upmost metal layer 210d of the intermediate structure 204 can be formed with metal patterns not only to provide mechanical support to the overlying metal pad 214 for sustaining stresses caused in sequential bonding processes but also to electrically connect the underlying metal layer 210c within the dielectric layer 212c. In this situation, additional conductive vias 220 and 222 are required and respectively provided in the dielectric layer 212d between the metal pad 214 and the underlying metal layer 210d and in the dielectric layer 212c between the metal layer 210d and the metal layer 210c thereunder. The metal layer 210c of the intermediate structure 204 is now underneath the metal pad 214 to enhance integrity of a semiconductor device and achieves maximum integrity when the metal layer 210c functions as a power line.

Therefore, a power input (not shown) can directly pass through a conductive bonding sequentially formed within the bonding region 218 and arrive at certain underlying devices 206 through the intermediate structure 204. The metal pad 214 capable of distributing power can thus function as a power pad.

Figure 7:
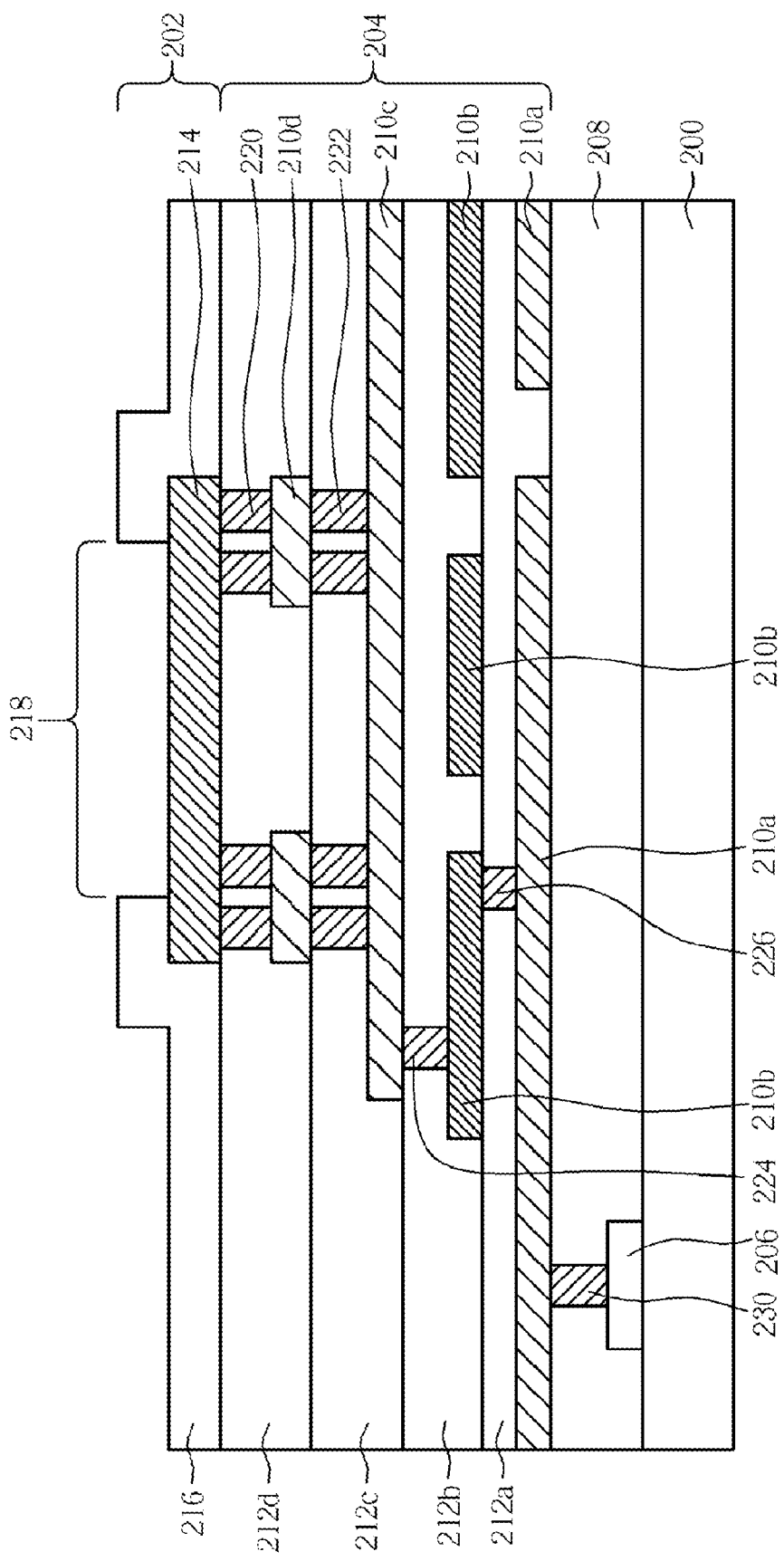
FIG. 7 is a cross section of another exemplary embodiment of a semiconductor device, having a bond pad structure overlies interconnect lines only.

FIG. 7 is a cross section of another exemplary embodiment of a semiconductor device, with a bonding pad structure overlies interconnect lines only, in which like numbers from the described exemplary embodiments are utilized where appropriate. In this embodiment, the bond pad structure is also illustrated as a bond pad for power distributing.

In FIG. 7, the bonding region 218 only overlies the underlying intermediate structure 204 and no device 206 is formed thereunder. A device 206 can be formed under a region other than the bonding region 218 and electrically connect the overlying intermediate structure 204 and bond pad structure 202 through a conductive contact 230 and conductive vias 220, 222, 224, 226, respectively, as shown in FIG. 7. Interconnections between the bond pad structure 202, the intermediate structure 204, and the devices 206 are not limited by that illustrated in FIGS. 3, 6, and 7. Those skilled in the art can properly modify interconnections therebetween according to real practices.

Figure 8:
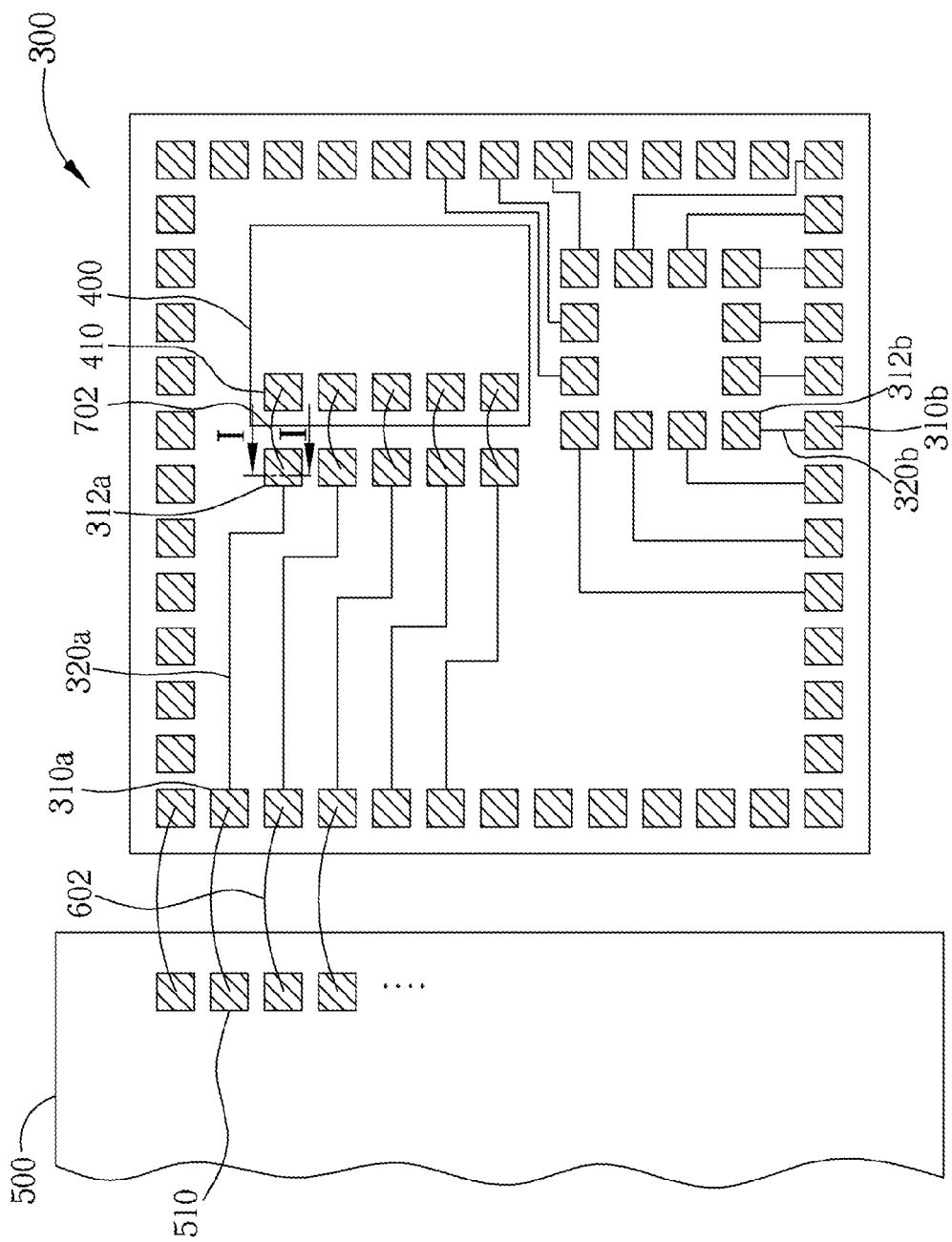
FIG. 8 is a schematic diagram illustrating a top view of a semiconductor device utilizing the novel bond pad structure in accordance with another preferred embodiment of this invention.

FIG. 8 is a schematic diagram illustrating a top view of a semiconductor device utilizing the novel bond pad structure in accordance with another preferred embodiment of this invention. As shown in FIG. 8, a semiconductor die 300 is provided. A plurality of bond pads 310a and 310b are provided along the four sides of the semiconductor die 300. The bond pads 310a and 310b has the same bond pad structure as that shown in FIG. 3, 6 or 7. A guard ring region, which protects the inner circuit region from damage due to die separation or dicing, is not shown in this figure. The bond pads 310a or 310b are wire-bonded to corresponding bond pads or fingers 510 of an outer circuit device 500 such as a lead-frame or a packaging substrate by means of gold wire 602 formed by wire bonding methods.

Re-distributed layer (RDL) pads 312a and 312b, which are re-routed from bond pads 310a and 310b through wiring routes 320a and 320b respectively, are provided on the semiconductor die 300. According to the preferred embodiment, the bond pads 310a or 310b, the RDL pads 312a and 312b, and the wiring routes 320a and 320b are formed from the same metal layer, for example, the topmost aluminum layer, and are defined at the same time. It is noteworthy that layouts of the bond pads 310a, 310b and RDL pads 312a, 312b over the semiconductor die 300 are not limited to those illustrated in FIG. 8 and can be modified by those skilled in the art.

A semiconductor die 400 is mounted on the top surface of the semiconductor die 300. The semiconductor die 400 may be a dynamic random access memory (DRAM), SDRAM, flash memory chip or die, or other functional IC chip or die. The semiconductor die 400 has a plurality of bond pads 410 arranged at its periphery region, which are wire-bonded to corresponding RDL pads 312a by means of gold wire 702 formed by wire bonding methods. It is one kernel feature of the invention that the RDL pads 312a, which are wire-bonded to the bond pads 410 of the semiconductor die 400, have the same bond pad structure as that shown in FIG. 3, 6 or 7.

The RDL pads 312b, which are arranged in an array manner in this case, are used to implement flip-chip bonding for mounting another chip or die (not shown) onto the semiconductor die 300. The RDL pads 312b may also have the same bond pad structure as that shown in FIG. 3, 6 or 7, but not limited thereto.

Figure 9:
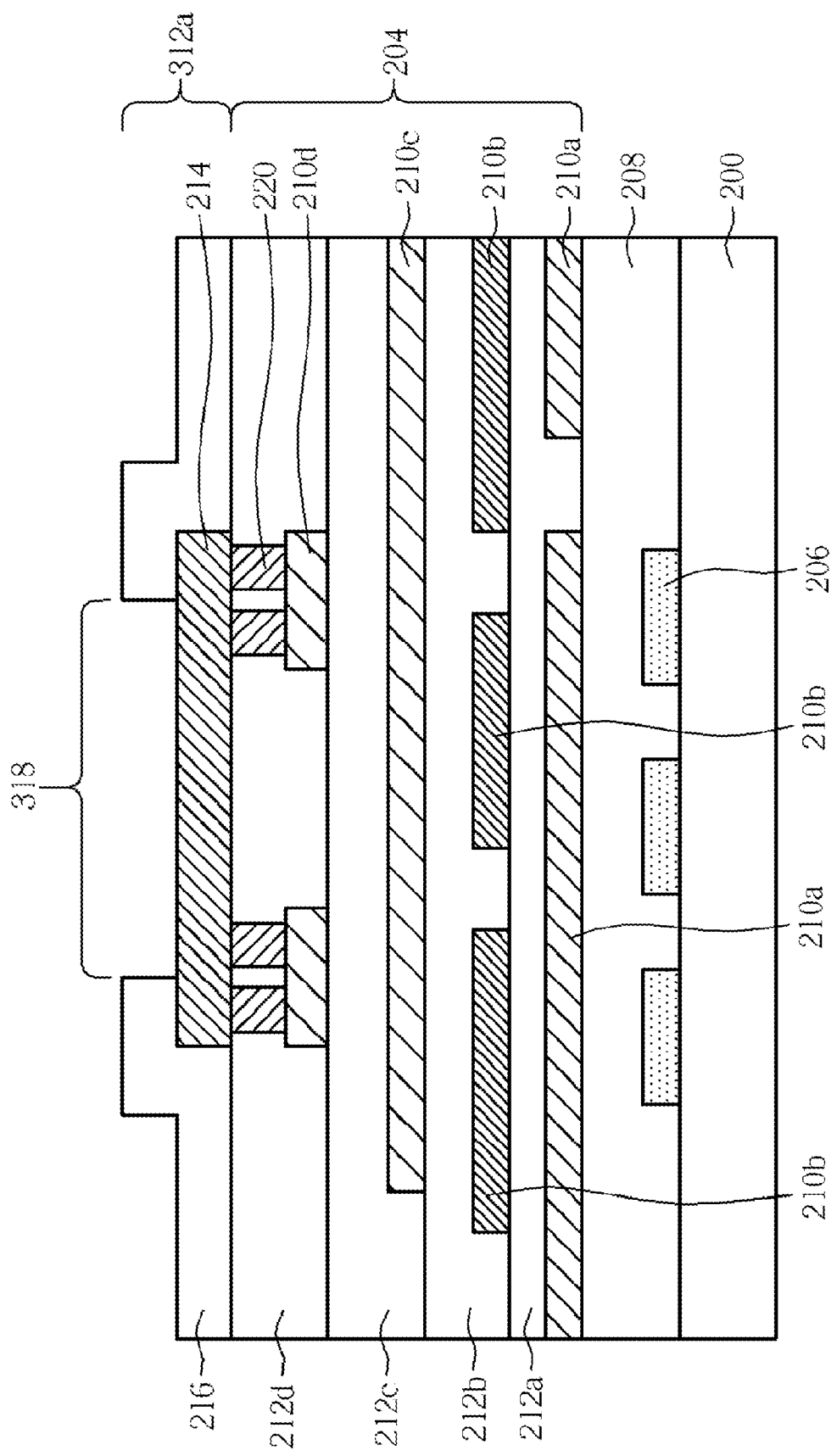
FIG. 9 is a cross section taken along line 1-1 of FIG. 8, showing an exemplary structure of the RDL pad formed over a substrate.

FIG. 9 is a cross section taken along line I-I of FIG. 8, showing an exemplary structure of the RDL pad 312a formed over a substrate 200, wherein like numerals designate like elements, layers and regions. In FIG. 9, likewise, the substrate 200 is provided with devices 206 thereon. The devices 206 can be active devices such as MOS transistors or passive devices such as capacitors, inductors and resistors. These devices 206 are not limited to being formed on the substrate 200 and some of these devices 206 can be formed in the substrate 200 to thereby enhance die size reduction. Devices 206 can be formed by well-known fabrication methods and as such will not be described here.

Dielectric layer 208 is provided over and between the devices 206 and an intermediate structure 204 is provided on the dielectric layer 208. The dielectric layer 208 provides insulation between the devices 206. The intermediate structure 204 comprises a plurality of metal layers 210a, 210b, 210c, and 210d respectively formed within dielectric layers 212a, 212b, 212c, and 212d, thereby functioning as an interconnect structure for electrically connecting the underlying devices 206 and the overlying RDL pad 312a. In some cases, the intermediate structure 204 electrically connecting the overlying RDL pad 312a may electrically connect the electric device 206 at any region within the semiconductor die. Connection therebetween can be achieved by forming conductive contacts (not shown) in the dielectric layer 208 at a position relative to the device 206 and is well known by those skilled in the art.

The metal layers 210a-d are electrically connected by conductive vias (not shown) properly formed in the dielectric layers 212a-d. The conductive layers 210a-d can function as routing, signal or power lines along or in combination. Fabrication of such an intermediate structure 204 can be achieved by well known interconnect fabrication methods, such as single/dual damascene process or other known line fabricating techniques. The metal layers 210a-d can comprise, for example, copper, aluminum, or alloys thereof. The dielectric layers 212a-d can comprise, for example, doped or undoped oxide or commercially available low k dielectrics and can be formed by, for example, plasma enhanced chemical vapor deposition (PECVD).

Likewise, the RDL pad 312a is partially covered with the passivation layer 216 and has an exposed bonding window 318 for subsequent conductive bonding to the semiconductor die 400 adjacent to the RDL pad 312a. The passivation layer 216 and bonding window 318 can be formed by well-known methods and will not be described here. The RDL pad 312a may comprise aluminum, copper, or alloys thereof. The passivation layer 216 can comprise, for example, silicon nitride, polyimide or silicon oxide, preferably silicon nitride.

The RDL pad 312a is formed above a circuit region having underlying interconnecting lines (referring to metal layers 210a-d) and/or devices 206. The topmost metal layer 210d of the intermediate structure 204 acts as a stress-releasing metal. The metal layer 210d, which is preferably rectangular ring-shaped, provides mechanical support to the overlying RDL pad 312a and sustain stresses exerted on the RDL pad 312a caused in subsequent wire-bonding processes. For this purpose, additional conductive vias 220 are required and provided in the dielectric layer 212d between the RDL pad 312a and the underlying metal layer 210d to thereby forming a cushion structure to enhance upward mechanical support. The cushion structure includes at least a via layer and a support metal layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first semiconductor die comprising a plurality of first bond pads formed on a peripheral region of the first semiconductor die, a plurality of re-distributed layer (RDL) pads formed on a center region of the first semiconductor die, and a plurality of wire routes interconnecting the first bond pads and the RDL pads;
   a second semiconductor die disposed over the first semiconductor die, wherein the second semiconductor die has a plurality of second bond pads electrically connecting to the RDL pads via bonding wires; wherein the RDL pad is supported by at least a layer of stress-releasing metal disposed directly underneath the RDL pad.

2. The semiconductor device according to claim 1 wherein the layer of stress-releasing metal is interconnected with the overlying RDL pad through a via metal layer.

3. The semiconductor device according to claim 1 wherein the layer of stress-releasing metal comprises copper.

4. The semiconductor device according to claim 1 wherein the layer of stress-releasing metal is rectangular ring-shaped.

5. The semiconductor device according to claim 1 wherein the layer of stress-releasing metal sustains stresses exerted on the RDL pad caused in subsequent wire-bonding processes.

6. The semiconductor device according to claim 1 wherein the plurality of first bond pads are wire-bonded to an outer circuit device.

7. The semiconductor device according to claim 6 wherein the outer circuit device comprises a lead-frame and package substrates.

8. The semiconductor device according to claim 1 wherein the first bond pads, the RDL pads and the wire routes are formed of aluminum.

9. The semiconductor device according to claim 1, further comprising at least one device formed within or over the substrate, wherein the at least one device underlies the RDL pad.

* * * * *